(12) United States Patent
Osako et al.

(10) Patent No.: US 8,383,984 B2
(45) Date of Patent: Feb. 26, 2013

(54) METHOD AND APPARATUS FOR LASER SINGULATION OF BRITTLE MATERIALS

(75) Inventors: Yasu Osako, Lake Oswego, OR (US); Daragh Finn, Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 383 days.

(21) Appl. No.: 12/753,367

(22) Filed: Apr. 2, 2010

(65) Prior Publication Data

US 2011/0240616 A1 Oct. 6, 2011

(51) Int. Cl.
*B23K 26/00* (2006.01)

(52) U.S. Cl. ............... 219/121.72; 219/121.67

(58) Field of Classification Search ............ 219/121.72, 219/121.67, 121.69, 121.66
See application file for complete search history.

(56) References Cited

U.S. PATENT DOCUMENTS

| | | | |
|---|---|---|---|
| 5,747,769 A * | 5/1998 | Rockstroh et al. | 219/121.71 |
| 6,271,102 B1 | 8/2001 | Brouillette et al. | |
| 6,841,482 B2 * | 1/2005 | Boyle | 438/708 |
| 6,992,026 B2 | 1/2006 | Fukuyo et al. | |
| 7,129,114 B2 | 10/2006 | Akram | |
| 7,169,687 B2 * | 1/2007 | Li et al. | 438/463 |
| 7,173,212 B1 | 2/2007 | Semak | |
| 7,405,137 B2 | 7/2008 | Terayama et al. | |
| 7,633,034 B2 * | 12/2009 | Bruland et al. | 219/121.68 |
| 8,148,211 B2 * | 4/2012 | Bruland et al. | 438/131 |
| 2006/0249480 A1 | 11/2006 | Boyle | |
| 2006/0258047 A1 | 11/2006 | Nishiwaki et al. | |
| 2009/0046754 A1 | 2/2009 | Kohda | |
| 2010/0243625 A1 | 9/2010 | Osako | |

FOREIGN PATENT DOCUMENTS

| | | |
|---|---|---|
| KR | 2002-0047479 A | 6/2002 |
| WO | 2008/064863 | 6/2008 |

OTHER PUBLICATIONS

International Search Report and Written Opinion of PCT Application No. PCT/US2011/030768, 5 pages.

\* cited by examiner

*Primary Examiner* — Roy Potter (57) ABSTRACT

An improved method for singulation of electronic substrates into dice uses a laser to first form cuts in the substrate and then chamfers the edges of the cuts by altering the laser parameters. The chamfers increase die break strength by reducing the residual damage and removes debris caused by the initial laser cut without requiring additional process steps, additional equipment or consumable supplies.

50 Claims, 7 Drawing Sheets

METHOD AND APPARATUS FOR LASER SINGULATION OF BRITTLE MATERIALS

TECHNICAL FIELD

The present invention relates to improved methods and apparatus for machining feature in brittle materials. In particular, it relates to improved methods and apparatus for machining of workpieces containing electronic devices in which multiple copies of a device are constructed on a common substrate. In more particular it relates to device singulation or the separation of semiconductor wafers into individual devices using a laser.

BACKGROUND OF THE INVENTION

Figure 1:
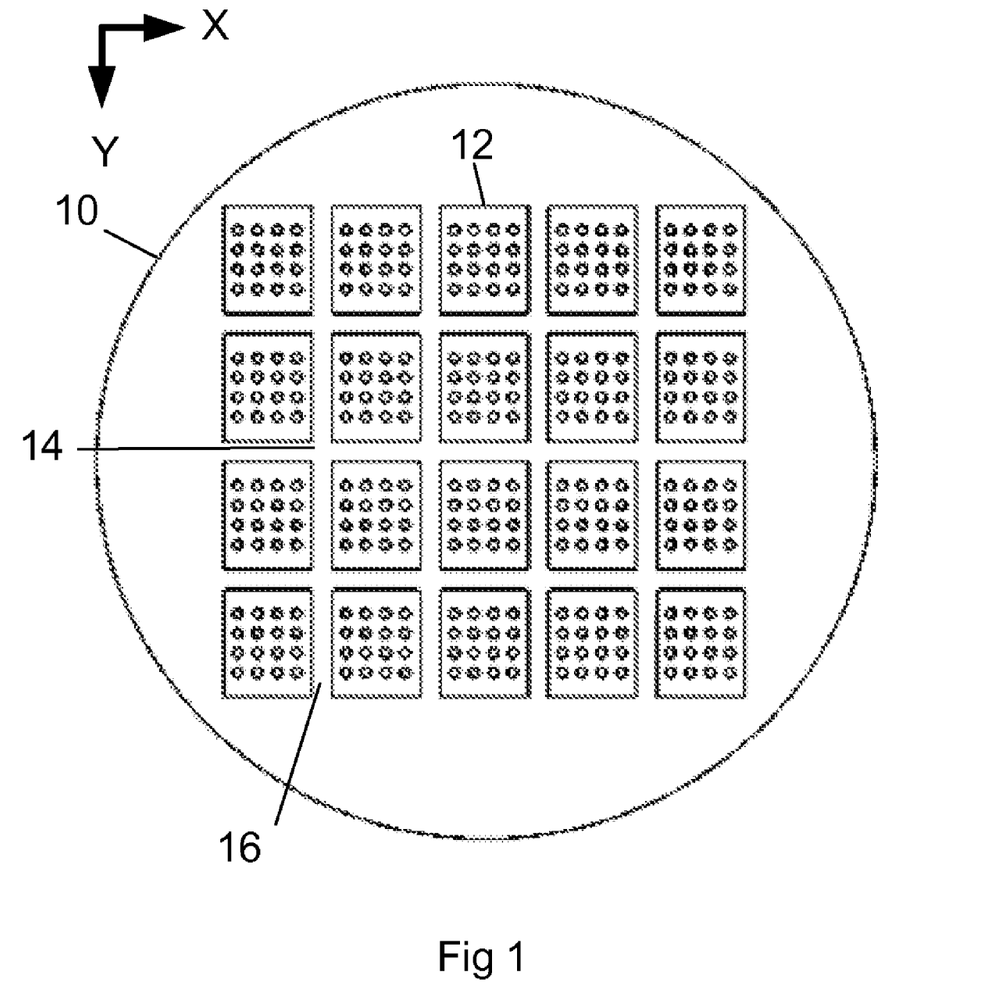
FIG. 1. Semiconductor wafer.

Electronic devices are typically manufactured by producing multiple copies of the same device on a substrate or workpiece. In particular, semiconductor devices are manufactured on substrates referred to as wafers, which are thin disks of materials such as silicon, gallium arsenide or sapphire or other materials which are capable of supporting the various processes that create semiconductor devices. These devices at some point in the manufacturing process need to be separated into individual devices for subsequent packaging and use. This separation into individual devices is referred to as "singulation". Singulation can be performed mechanically, using diamond-coated saw blades, chemically, by masking and etching, photonically by directing laser energy at the wafer or substrate, or combinations of these methods. Singulation can be accomplished by cutting completely through the wafer or substrate, or by making a partial cut or cuts into one or more surfaces of the wafer or substrate and then mechanically cleaving the wafer or substrate in to individual dice. Cutting completely through the wafer or substrate is commonly referred to as "dicing" and cutting partially through the wafer or substrate in preparation for subsequent cleaving is commonly called "scribing". In general, devices are rectangular in shape and are laid out on a grid pattern on the wafer or substrate, allowing the devices to be separated by making a series of cuts either fully through the substrate (dicing) or partially through the substrate (scribing) between the devices in first in one direction 16 and then in a direction at 90 degrees to the first direction 14, as illustrated in FIG. 1. Referring to FIG. 1, singulation of devices on substrates generally proceeds by forming a series of cuts in one direction, for example the X direction between each row of devices then forming a series of cuts in the perpendicular Y direction between each column of devices thereby separating each device from the other devices on the wafer.

Issues related to device singulation include real estate, device damage, cost, complexity and system throughput. Real estate refers to the fact that in order to permit singulation without damage to devices, room must be left between the devices to allow room for cuts to be made without having to cut through active devices. The area between the active devices is known as a "street". Streets 14, 16 are shown in FIG. 1 between active devices 12 on a wafer 10. Since the cost of processing a wafer or substrate is generally fixed, more devices per substrate yields greater profits for the manufacturer. This places a premium on making the streets as narrow as possible to squeeze as many active devices as possible onto the wafer or substrate. Factors working against narrow streets include the size of the kerf and the width of the damaged area next to the cut. While lasers typically can cut a narrower kerf than mechanical saws or chemical etch, lasers also typically create a heat affected zone (HAZ) next to the kerf due to the heat generated by the intense amount of energy required to cut the wafer or substrate. This HAZ should not be allowed to overlap the active device area or it may either cause part failures immediately or limit the useful life of the part. The HAZ also can cause device failure from cracks or chips in the HAZ propagating from the HAZ to the active device area of the device as the device is used.

Another problem related to laser singulation of wafers or substrates is the re-deposit of material removed from the kerf. The laser typically removes material from the substrate or wafer to form the kerf by both ablation and thermal means. The laser beam may be energetic enough to ablate material it impinges near the center of the beam, meaning that the material is ionized and forms a plasma cloud as it exits the kerf. Nearer the periphery of the beam or directly adjacent to the beam the material of the substrate may not receive enough energy to ablate the material but rather vaporizes or melts and boils the material. In this case the material is ejected from the kerf as it vaporizes or boils. As the material is ejected from the kerf and moves away from the laser beam it cools and re-solidifies as debris near the edges of the kerf. If this debris reaches active circuit areas of the device it can cause undesirable electronic malfunctions and therefore must be removed prior to packaging the device.

One means for predicting the reliability of semiconductor die which have been diced or scribed from a wafer is to test die break strength. In this test, a semiconductor die is subjected to bending to the point of failure. Variations is die break strength can predict semiconductor component failures, therefore, wafer dicing or scribing methods that improve die break strength also improve component reliability. Things that are known to reduce die break strength include chips or cracks along the edge of a cut caused by mechanical or laser cutting. In addition, debris re-deposited along the edge of the cut from materials vaporized or liquefied by the laser can cause damage to the circuit and reduce reliability.

Figure 2:
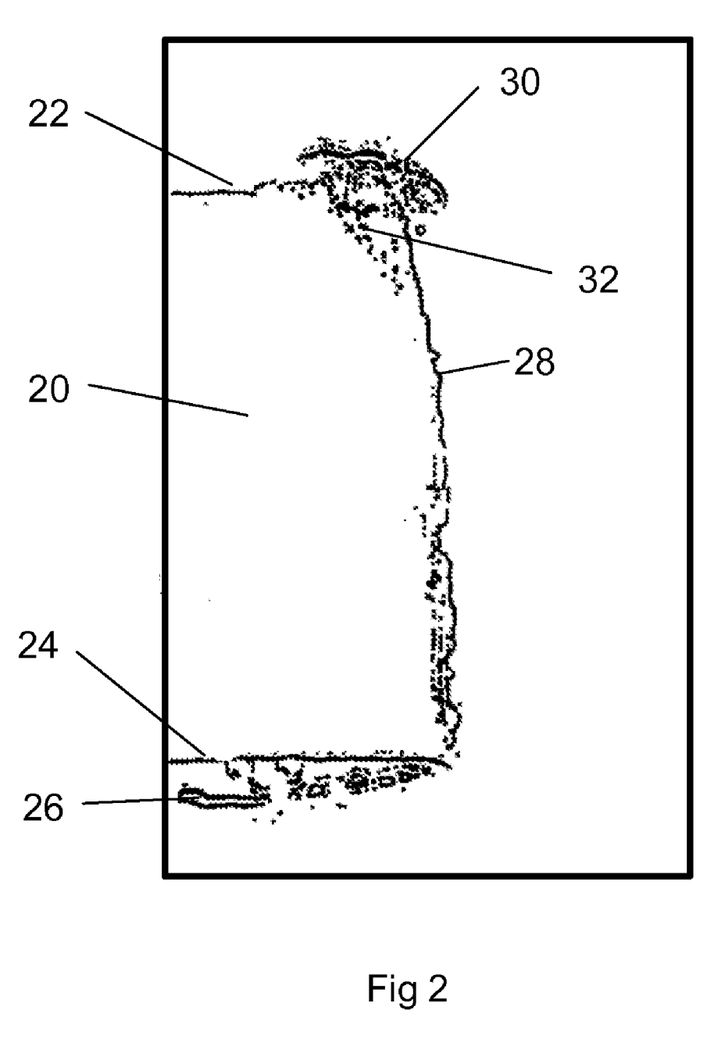
FIG. 2. Cross-sectional view of wafer cut.

In particular, laser parameters that provide desired cutting speed and kerf size and shape also cause a HAZ at the top edge of the cut and also tend to create debris from material removed the kerf which is re-deposited at the edge of the cut. FIG. 2 shows a cross-sectional view of a silicon wafer that has been cut with a laser showing the heat affected zone and debris caused by redeposit of material from the kerf. FIG. 2 shows a cross-sectional view of a cut wafer 20, having a top surface 22 and a bottom surface 24 and die attach film (DAF) 26. One side of the kerf 28 is shown. Also shown are re-deposited debris 30 and the HAZ 32. The HAZ can cause a reduction in die break strength and the re-deposited debris can cause device failure. An exemplary laser processing device for performing this singulation is the ESI Cignis Laser Singulation machine, manufactured by Electro Scientific Industries, Inc., Portland Oreg., 97229. This machine uses a picosecond laser to singulate silicon and other substrate materials.

Figure 3:
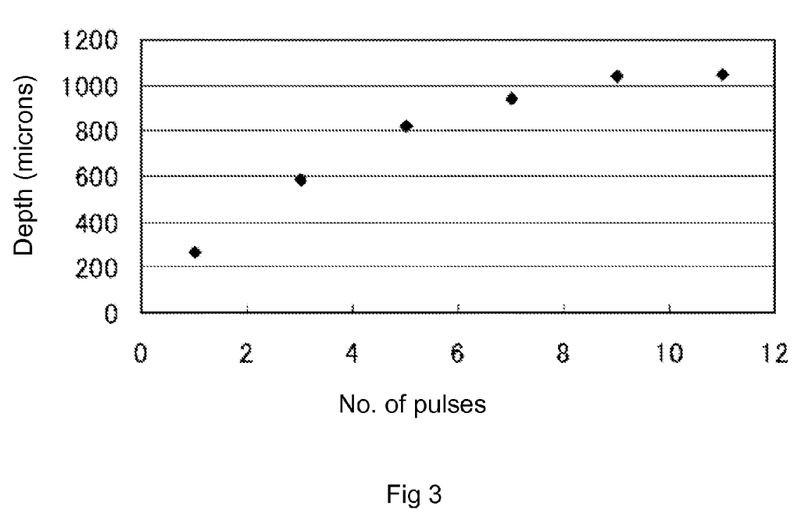
FIG. 3. Graph showing cut depth vs. number of pulses.

Another issue with laser singulation of substrates or wafers is improving system throughput. In particular, laser parameters which provide higher cutting speed also create more HAZ and re-deposited debris, which is undesirable. It is also noted that laser parameters which provide high cutting speed also create a debris cloud at the cutting site. This debris cloud is comprised of plasma created by the laser pulses and gaseous, liquid and solid debris created by the laser pulses and ejected from the workpiece. It is known that the debris cloud created by laser pulses can absorb energy from subsequent laser pulses. FIG. 3 is a graph showing depth of cut vs. number of pulses for an exemplary laser substrate cutting process. This shows that cutting a silicon workpiece with a 4 Watt Nd:YVO$_4$ laser with 10 nanosecond pulses aimed at a single point at a repetition rate of 5 KHz. As can be seen in FIG. 3, in this example cutting saturates at about 10 pulses. This saturation is believed to be caused by the debris cloud created by the first laser pulses. A debris cloud created in this manner not only blocks laser radiation from reaching the workpiece and prevents material removal it also absorbs laser energy heating the plasma further. As the plasma absorbs energy it heats up and due to its proximity to the workpiece transfers some of that heat energy to portions of the workpiece including sidewalls of the feature being machined. In addition vaporous, liquid or solid material in the cloud may be ejected from the cloud and deposited on the workpiece. This transferred energy and material causes cracking, deterioration of the feature sidewall and increased debris. In addition, if more energetic pulses or more pulses are directed to the workpiece in an effort to transmit more energy through the debris cloud to the workpiece and thereby continue to machine material, more energy is coupled into the debris cloud making the cracking, deterioration and debris problems worse. Even ultra fast processes which use short duration pulses in the picosecond or femtosecond range to ablate material before the material has time to transfer heat to adjacent regions cannot avoid coupling energy into the debris cloud. This energy causes consequent damage to the workpiece depending upon the material and the laser parameters used.

Issues related to dicing or scribing wafers or substrates have been the subject of previous work. U.S. Pat. No. 6,271,102 METHOD AND SYSTEM FOR DICING WAFERS, AND SEMICONDUCTOR STRUCTURES INCORPORATING THE PRODUCTS THEREOF, inventors Donald W. Brouillette, Robert F. Cook, Thomas G. Ference, Wayne J. Howell, Eric G. Liniger, and Ronald L. Mendelson, Aug. 7, 2001, describes cutting wafers with chamfered edges with a saw blade prior to laser cutting from both the front and backside to improve die break strength. In this case the chamfered cuts are produced instead of straight cuts with either a laser or a saw. U.S. Pat. No. 7,129,114 METHODS RELATING TO SINGULATING SEMICONDUCTOR WAFERS AND WAFER SCALE ASSEMBLIES, inventor Salman Akram, Oct. 31, 2006, tries to solve the problem of die break strength by scribing trenches next to the laser cut and coating the trenches with protective material. US patent publication No. 2006/0249480, LASER MACHINING USING AN ACTIVE ASSIST GAS, inventor Adrian Boyle, Nov. 9, 2006, discloses using an assist gas to etch away the damaged portion of the edges of the cuts to improve die break strength. WIPO patent publication No. 2008/064863 LASER MACHINING, inventors Kali Dunne and Fallon O'Briain, Jun. 5, 2008 discusses using particular patterns of laser pulse spacing along the path being cut with multiple passes to avoid the debris cloud.

What these references have in common is a desire to improve die quality following dicing or scribing by attempting to overcome problems with die break strength and debris caused by laser cutting. These methods either require that cutting be done from both the top and the bottom of a wafer, be accomplished by a combination of laser and mechanical sawing, or require additional processing steps and equipment such as chemical etching, or require multiple passes by the laser. What is needed then is an efficient way to dice wafers with a laser that does not require additional processing steps, passes or equipment and provides a wafer with improved die break strength and reduced debris by avoiding the debris plume caused by laser machining.

SUMMARY OF THE INVENTION

This invention is an improved method and apparatus for laser machining brittle materials. Aspects of this invention include providing a laser having laser parameters and making a first cut in the workpiece with the laser using first laser parameters, then making a second cut in the workpiece with the laser using second laser parameters, the second cut being adjacent to the first cut while avoiding the debris cloud created by the first laser cut. Aspects of this invention further include moving the point at which the laser intersects the workpiece in order to avoid the debris cloud created by the previous cut and then making a cut with a laser using second laser parameters. Aspects of this invention gain the advantages of laser processing, including increased throughput, smaller street sizes and reduced consumable cost, while eliminating problems associated with lasers such as the heat affected zone and re-deposit of debris, thereby increasing die break strength.

Embodiments of this invention can be implemented by adapting an existing laser wafer singulation system, the ESI Cignis Wafer Singulation system, manufactured by Electro Scientific Industries, Inc., Portland Oreg. This system uses a picosecond laser to dice or scribe semiconductor wafers. In operation, the wafer is fixtured on the system and then the laser beam is moved in relation to the wafer by the motion stages while the laser is pulsed, thereby making the linear cuts required to singulate wafers. This system is adapted to accomplish aspects of this invention by altering the laser parameters used, including possibly the type of laser employed. In addition, the laser parameters need to be programmably controlled in order to change laser parameters between cuts. The system needs to be adapted to allow subsequent laser cuts to be made adjacent or close to the previous cut while avoiding the debris cloud. In this aspect of this invention the laser pulses machine a particular area with a number of pulses up to a limit predetermined by the number of pulses required to saturate the location and then move rapidly to an adjacent location away from the debris cloud to continue machining in an unsaturated location. Saturation refers to the reduction in machining efficiency of a series of laser pulses caused by absorption of laser energy by the debris cloud as a function of number of pulses.

Aspects of this invention singulate substrates or wafers by first making a laser cut in the substrate or wafer. Laser parameters are adjusted to provide desired cutting speed and kerf size and shape. This laser cut is made partially through the wafer or substrate. The laser parameters associated with this cut are selected so as to minimize cracking and re-deposited debris. Lower fluence laser parameters increase cutting time but since this cut is only partially through the wafer or substrate the impact on system throughput is not great. Also note that these initial laser cuts may require multiple passes of the laser beam to make the cut to the depth desired or the laser beam may be directed to impinge on the substrate of wafer at various points while cutting.

Following the initial cut, aspects of this invention adjusting the laser parameters to increase the laser fluence at the surface of the wafer or substrate and then directing the laser beam to machine a through cut in the wafer or substrate adjacent to the previous cut. Laser parameters are adjusted to permit the laser beam to remove material from the wafer while minimizing additional damage to the wafer or substrate. This is because the debris cloud created by the laser pulses making the second cut has room to expand into the space made by the previous cut. In this way the debris cloud dissipates more rapidly permitting increased repetition rate pulsing with more energetic pulses which supports improved throughput while reducing cracking and re-deposited debris. This permits increased throughput with increased die break strength. Aspects of this invention can also process wafers or substrates in an iterative fashion, alternating first laser parameter cuts with second parameters cuts as the cuts go deeper into the wafer or substrate. Laser pulses are focused at increasing depths to permit machining deeper and deeper cuts into the material.

An advantage of processing substrates or wafers according to aspects of this invention is that the first cut processing can take place on the same laser processing system that makes the second cuts. The ESI Cignis Laser Singulation system that made the initial cuts is adapted to create the cut without causing additional damage to the substrate of wafer by modifying the laser parameters associated with the laser processing beam to permit the laser to remove material from the substrate of wafer without creating a HAZ or debris. This is possible because far less material is being removed per unit time, therefore the laser fluence can be lower. The system is also adapted to permit machining adjacent locations efficiently.

Another aspect of this invention singulate substrates or wafers by first machining at a location with a number of laser pulses with particular laser parameters up to the saturation limit for that particular material with those laser parameters. The laser pulses are then rapidly directed to a location adjacent or near the first location by the laser processing system and machining continued with a number of pulses with second laser parameters up to a second saturation limit. This embodiment uses compound beam positioning to direct the laser pulses to the desired locations on the workpiece to achieve the desired system throughput.

Advantages of these aspects of this invention are that the substrate or wafer does not have to be moved and re-aligned on a separate machine nor does it have to be flipped and put back into the machine for laser processing from a different side, nor does the machine have to be designed to process substrates or wafers from both sides. In addition, no chemicals or additional process steps such as depositing an additional layer of material on the wafer or substrate are required by aspects of this invention. While this requires at least two passes to process a single cut in a wafer or substrate, the number of passes are substantially less than approaches that skip adjacent locations rely on multiple passes. Processing wafers or substrates according to aspects of this invention improves die break strength and removes re-deposited material from singulated devices without requiring additional equipment, process steps or consumable supplies.

DETAILED DESCRIPTION OF THE PREFERRED EMBODIMENTS

This invention is an improved method for laser singulation of electronic devices fabricated on a substrate or wafer. An embodiment of this invention includes a laser processing system having a laser having laser parameters. This embodiment uses this laser to make a partial cut in the substrate or wafer using a first set of laser parameters. These parameters allow the laser to make the desired cut in the wafer or substrate with an acceptable kerf width and at an acceptable rate without creating unacceptable HAZ or re-deposited debris. This embodiment then cuts the wafer or substrate with a laser using second set of laser parameters adjacent to the first cut. Making the second cut adjacent to the first cut allows the debris cloud from the substrate or wafer to being cut to dissipate into the volume of the first cut, thereby reducing the deleterious effects associated with heating the debris cloud with subsequent laser pulses. Workpieces machined in this fashion exhibit improved die break strength and reduced debris. This embodiment gains the advantages of laser processing, including increased throughput, smaller street sizes and reduced consumable cost, while eliminating problems associated with lasers such as the heat affected zone and re-deposit of debris.

An embodiment of this invention singulates substrates or wafers by making laser cuts partially through the substrate or wafer in preparation for subsequent through-cutting with a second cut made adjacent to the first. Referring to FIG. 1, a wafer 10 has electronic devices 12 fabricated on a surface of wafer 10. These electronic devices are separated by horizontal 14 and vertical 16 streets. Streets are areas of the wafer or substrate that has been left between the active devices to permit room for the singulation without harming the active devices. Singulation of devices on substrates generally proceeds by forming a series of cuts in one direction, for example the X direction (horizontal street 14) between each row of devices then forming a series of cuts in the perpendicular Y direction (vertical street 16) between each column of devices, thereby separating each device from the other devices on the wafer. Laser parameters are adjusted to provide desired cutting speed and kerf size and shape. These initial laser cuts may require multiple passes of the laser beam to make the cut to the depth desired or the laser beam may be directed to impinge on the substrate of wafer at various points while cutting.

Figure 4A:
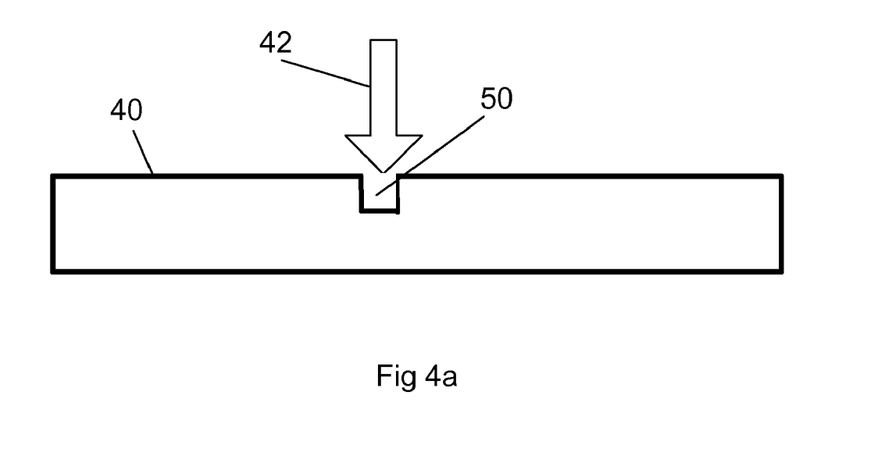
FIG. 4a. Wafer with first cut.

Making the initial cut in a wafer or substrate is shown in FIG. 4a. In FIG. 4a, a laser beam 42 is directed at a workpiece 40 to remove material from the wafer 40 to form an initial cut 50. Laser parameters are chosen to permit removal of material from the workpiece at an acceptable rate while creating minimal HAZ and debris. Exemplary laser parameters used by an embodiment of this invention to create the initial cut are shown in Table 1.

TABLE 1

| First laser pulse parameters | |
|---|---|
| Laser Type | DPSS Nd:YVO$_4$ |
| Wavelength | 355-1064 nm |
| Pulse Duration | 10 ps-250 ns |
| Pulse Temporal | Gaussian/square/tailored |
| Laser Power | 1-14 W |
| Rep Rate | 10 KHz-1 MHz |
| Speed | 50-2500 mm/s |
| Pitch | 8-12.5 microns |
| Spot Size | 6-20 microns |
| Spot Shape | Gaussian/Top Hat (round or square) |
| Focal Height | 0-100 mm |

Figure 4B:
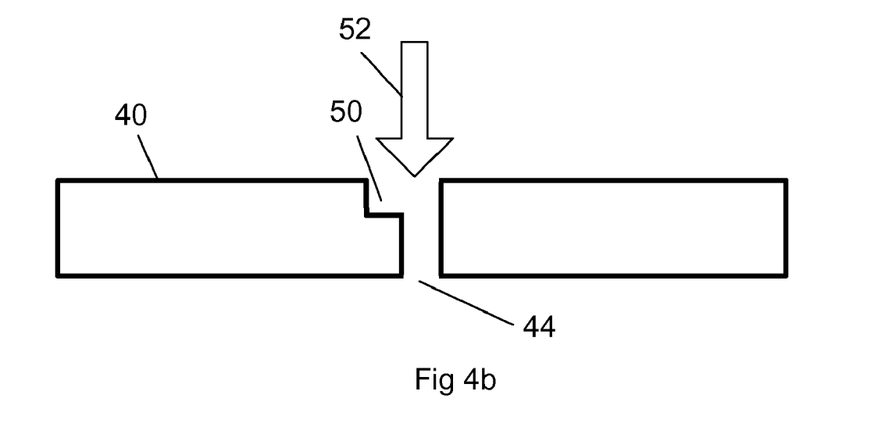
FIG. 4b. Wafer with first and second cut.

Following the initial cut, an embodiment of this invention changes the laser parameters to parameters suited to laser machining through cuts with acceptable throughput rates. This process is shown in FIG. 4b. In FIG. 4b, the workpiece, 40, has been laser machined by laser pulses 52 to form a through cut 44. As the laser pulses 52 machine the through cut 44, the debris could (not shown) from the through cut 44 escapes from the volume currently being machined into the cut 50 made in the previous step, thereby reducing the density and volume of the debris cloud blocking the laser pulses 52 from reaching the bottom of the cut 44 as it is being made. Exemplary second laser pulse parameters used to form the trough cut 44 on workpiece 40 are given in Table 2.

TABLE 2

Second laser pulse parameters

| Laser Type | DPSS Nd:YVO$_4$ |
|---|---|
| Wavelength | 355-1064 nm |
| Pulse Duration | 10 ps-250 ns |
| Pulse Temporal | Gaussian/square/tailored |
| Laser Power | 1 W-14 W |
| Rep Rate | 10 KHz-1 MHz |
| Speed | 1000-4000 mm/s |
| Pitch | 6-20 microns |
| Spot Size | 6-20 microns |
| Spot Shape | Gaussian/Top Hat (round or square) |
| Focal Height | 0-100 mm |

Second laser parameters are selected to permit the laser pulse to laser machine the through cut at acceptable throughput rates. One way an embodiment of this invention can accomplish this is by increasing the laser pulse fluence at the workpiece. Laser pulse fluence can be increased by increasing the laser pulse power, increasing the pulse duration, decreasing the spot size, changing the focal height, or decreasing the pulse repetition rate. Any or all of the changes, among others, can increase laser fluence at the workpiece and permit more rapid material removal. This is possible without increasing HAS or debris and thereby reducing die break strength because the first cut allows the debris cloud to dissipate and reduce the tendency to block subsequent pulses from reaching the workpiece.

Figure 5A:
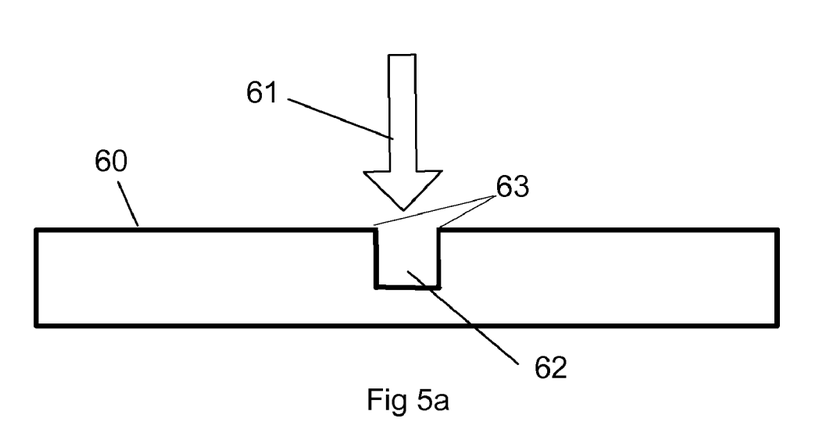
FIG. 5. Graph showing cut depth vs. number of pulses.
Figure 5B:
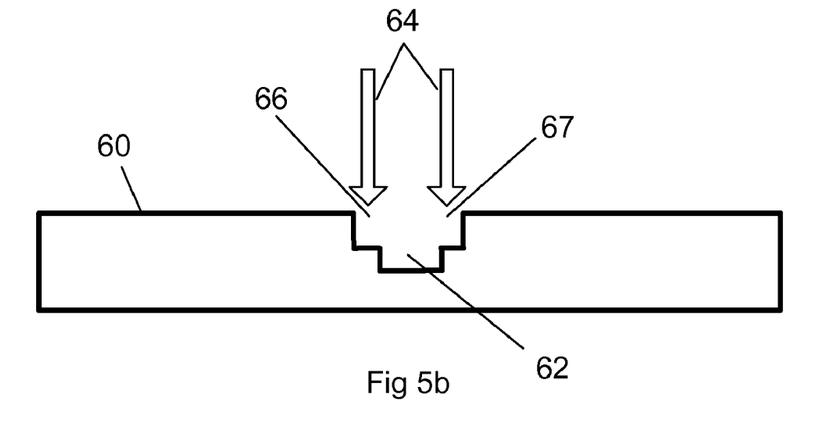
Figure 5C:
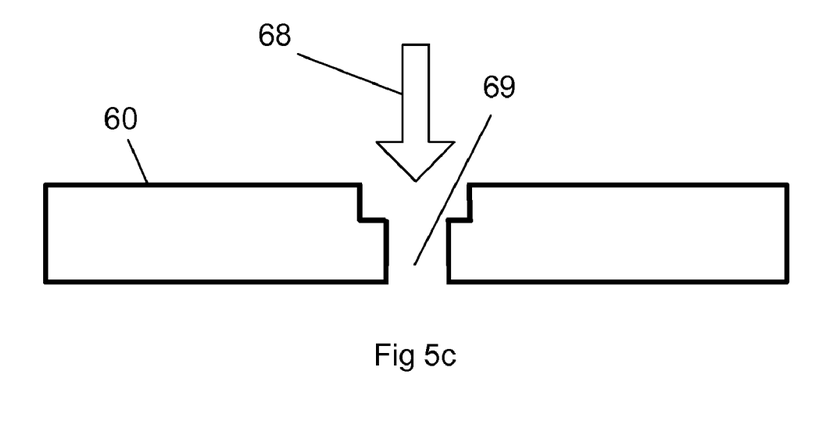

Other embodiments of this invention singulate substrates or wafers by first machining at a location with a number of laser pulses with particular laser parameters up to the saturation limit for that particular material with those laser parameters. The laser pulses are then rapidly directed to a location adjacent or near the first location by the laser processing system and machining continued with a number of pulses with second laser parameters up to a second saturation limit. This embodiment uses compound beam positioning to direct the laser pulses to the desired locations on the workpiece to achieve the desired system throughput. FIGS. 5a, b and c show a three step embodiment of this invention. In FIG. 5a, a workpiece 60 is impinged by laser pulses 61 machining a first feature 62. The number of laser pulses is less than the predetermined saturation limit of the material with the particular laser parameters used. Note that these laser parameters may be allowed to cause damage to the workpiece adjacent 63 to the feature 62 in order to increase the machining rate. In the second step of the process, shown in FIG. 5b, laser pulses 64 with second laser parameters impinge workpiece 60 with a number of laser pulses less than the saturation limit machine additional features 66, 67 adjacent to first feature 62. Second laser parameters are selected to remove material without causing damage to the adjacent areas. In the third step, shown in FIG. 5c, laser pulses 68 with third laser parameters impinge workpiece 60 with laser to complete machining a through cut 69. Note that the adjacent features 66 and 67 provide relief for the debris cloud generated by laser pulses 68, thereby assisting the debris cloud in dissipating and thereby increasing the saturation limit.

These particular laser parameters are exemplary. Laser pulse parameters and can be altered to suit the particular substrate or wafer being cut. Laser Type could be any laser capable of producing pulses with the required wavelength, energy, pulse width and repetition rate. For example Nd:YAG, Nd:YVO4, Nd:YLF and fiber lasers all could be used for application such as this. These lasers can be adapted by harmonic generation where non-linear optical elements are used in the laser (FIG. 7, 70) to generate second, third or fourth harmonics of the original laser pulses to decrease the wavelength of the laser pulses. In addition, a continuous wave (CW) laser can be adapted for this application by the use of laser beam optics (FIG. 7, 74) which chops or otherwise shapes the CW beam into pulses. Wavelength choice depends upon the material being cut. Pulse Duration measures the length of each pulse and for basically Gaussian pulses is measured by calculating either the full width at half maximum (FWHM) or $1/e^2$ width of the pulse. Long duration pulses cut material quickly but tend to couple excessive thermal energy into the wafer, thereby causing large HAZs and creating lots of debris. Short duration pulses tend to be better in this respect but take longer to cut workpieces and can require very expensive lasers. Pulse Temporal distribution can affect how the laser interacts with the material. By modifying the typical Gaussian distribution, the manner in which energy from the laser pulse is transmitted to the substrate or wafer. For example, electro-optical components can be placed in the optical path of the laser beam to temporally shape the laser pulse to provide control over pulse rise time, fall time and to possibly add one or more "power spikes", which are parts of the laser pulse where the laser power is increased so that a narrow spike of power greater than 25% above the average power of the pulse, thereby "tailoring" the pulse. These pulses can also be chopped or otherwise modified by the laser beam optics to produce temporally "square" pulses. Non-Gaussian pulses require that Pulse Duration be measured by different measures than FWHM or $1/e^2$, for example the integral square method which involves a dividing the squared integral by the integral squared to calculate Pulse Duration. Fast rise times will couple laser energy into the workpiece and cause ablation faster than thermal transfer can transfer heat to adjacent regions. Fast rise times therefore can help to reduce HAZ.

Laser Power describes how much average energy can be input to the wafer or substrate to perform cutting. Typically with pulsed lasers the average power is calculated over a period of time that encompasses many pulses, for example one second, in order to accurately assess how much energy is being input to the wafer per unit time. Repetition Rate is the rate at which pulses of a given energy can be emitted by the laser on a continuous basis. Speed refers to the rate at which the laser beam is moved in relation to the wafer or substrate as the laser is pulsed. For a given laser pulse energy, pulse size and repetition rate, the speed at which the beam is moved in relation to the wafer or substrate will determine the total dose or fluence delivered to the wafer or substrate by the laser pulses. The pitch is similar to speed and is defined as the distance between successive pulses delivered to the wafer or substrate. Pitch is a function of repetition rate and speed. Spot Size is a measure of the size of the laser pulse as it impinges on the wafer or substrate. It is related to focal spot size, which is the minimum diameter of the laser beam waist measured at the focal distance of the optical system delivering the beam to the workpiece. Spot Size will differ from the focal spot size depending upon how far the laser beam focal distance is from the surface of the workpiece. As the laser beam focal distance is moved from the surface of the workpiece, the laser beam becomes unfocused and the Spot Size becomes larger and thereby reduces the laser fluence. Spot Shape is a description of the spatial shape of the laser beam. Optical elements are placed in the optical path of the laser beam to cause the beam to assume various cross-sectional distributions. For example, a diffractive optical element is used to alter the laser beam from a basically Gaussian cross-section to a "top hat" distribution where the laser energy is distributed evenly over the focal spot rather than falling off at the edges as with a Gaussian distribution. Spot Shape can also be asymmetric. One example of an asymmetric Spot Shape is an elliptical spot, wherein optical elements in the laser beam optical path cause the laser beam to assume an elliptical cross-section, where one axis is larger than another. The spot can also be apertured by the laser beam optics to cause the focal spot to assume a circular or square cross-section, for example. Focal Height is a measure of the distance between the focal distance and the surface of the workpiece. Since the laser spot goes out of focus as Focal Height differs from zero, for a given set of laser optics, Focal Height will determine the Spot Size on the workpiece.

Figure 6:
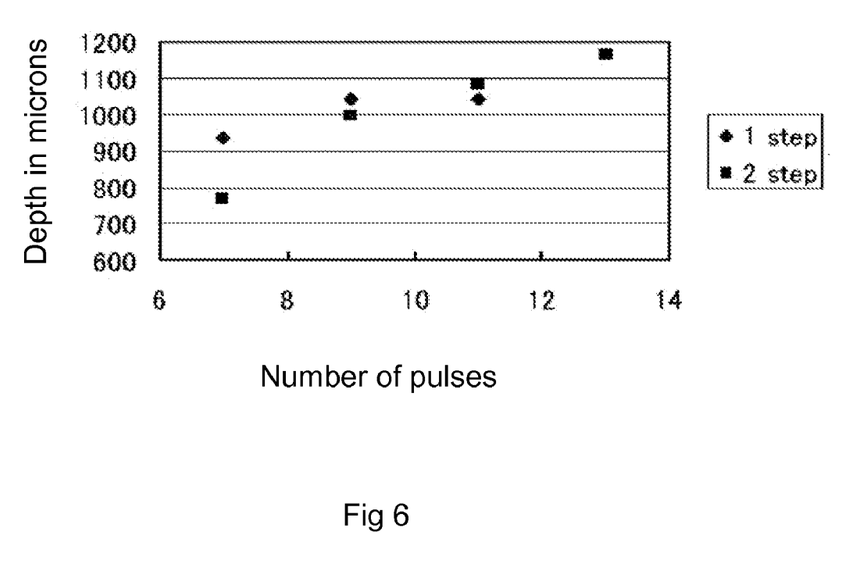
FIG. 6. Adapted laser processing system.

FIG. 6 is a graph showing the results of using an embodiment of this invention to machine a workpiece with a laser. FIG. 6 graphs the depth of cut in microns versus the number of pulses for a one step process (diamonds) and a two step process (squares). As can be seen from the graph, cutting a partial feature and then making a second cut adjacent to the first cut permits the laser pulses to remove material at a greater rate than is possible without making the first cut. This is shown by the single cut depth of cut saturating prior to ten pulses being directed to the workpiece, whereas the two-cut depth of cut is still increasing past 12 pulses. This shows that the efficiency of the cut is increased thereby decreasing the amount of HAZ and debris created by laser machining.

Figure 7:
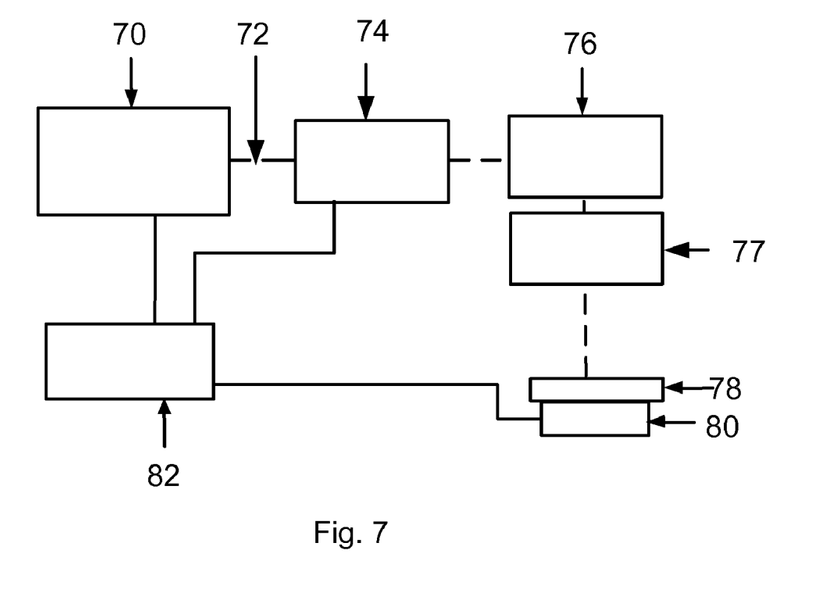

FIG. 7 shows a diagram of a laser processing system adapted for this application. A laser 70 emits laser pulses 72 which are shaped by laser beam optics 74 and then directed to the workpiece 78 by beam steering optics 76 and field optics 77. The workpiece 78 is fixtured on motion stages 80. The laser 70, laser beam optics 74, beam steering optics 76, field optics 77 and motion stages 80 are all controlled by controller 82. The laser 70 can be any one of the types of lasers discussed herein. The laser 70 can either be a continuous wave (CW) laser or a pulsed laser. In the case of a CW laser, the laser beam optics 74 are adapted to add a shutter function that effectively chops the CW laser into pulses with desired pulse duration and repetition rate. The laser beam optics 74 serve to collimate and focus the laser pulses to the correct size and shape and optionally use electro-optic components such as polarizers, electro-optical modulators or acoustic optical modulators to shape the pulses temporally. The laser beam optics 74 may also include a polarization based beam blocker to prevent reflected laser energy from being transmitted back into the laser 70 and thereby disrupt the lasing capability. The beam steering optics 76 can be electro-optical components that programmable direct the laser pulses to points on the workpiece. Exemplary beam steering components include galvanometers, piezo-electric devices, fast steering mirrors or electrical or acoustic optical modulators. The beam steering optics 76 may also include zoom optics focus height adjustments. The field optics 77 typically includes a field lens that permits the laser pulses 72 to be directed to various points on the workpiece 78 while maintaining substantially perpendicular orientation of the laser pulses 72 to the workpiece 78. The field optics 77 may also include an aperture and attendant optics to permit the laser pulses 72 to be shaped spatially. The controller 82 directs the motion stages 80 and the beam steering optics 76 to position the laser pulses 72 in relation to the workpiece 78. Note that embodiments of this invention can move either the laser pulses 72 or the workpiece 78 to accomplish the change in relative location.

This embodiment also employs compound beam positioning to increase system throughput. This increases throughput by coordinating the motion stages 80 with the beam steering optics 76 to allow the motion stages 80 to put the workpiece into motion with respect to the laser pulses 72 while the beam steering optics 76 compensate for the motion of the motion states 80 to allow the laser pulse 72 to impinge the workpiece 78 at a single location even as that location is moving relative to the laser pulses 72.

Having hereby disclosed the subject matter of the present invention, it should be obvious that many modifications, substitutions, and variations of the present invention are possible in view of the teachings. It is therefore understood that the invention may be practiced other than as specifically described, and should be limited in its breadth and scope only by the following claims.

We claim:

1. A method for laser machining a workpiece, comprising:
providing a laser having laser parameters;
performing a first cutting process with said laser using first laser parameters to make a first cut in said workpiece; and
after performing said first cutting process, performing a second cutting process with said laser using second laser parameters to make a second cut in said workpiece,
wherein said first laser parameters and said second laser parameters are selected such that a first laser fluence at the workpiece during the first cutting process is lower than a second laser fluence at the workpiece during the second cutting process, and
wherein said second cutting process is performed at a location substantially adjacent to a space created by said first cut such that debris generated during said second cutting process is transmittable into said space.

2. The method of claim 1 wherein said first laser parameters include laser type, wherein said laser type includes one of Nd:YAG, Nd:YLF or Nd:YVO$_4$ or fiber laser.

3. The method of claim 1 wherein said first laser parameters include wavelength, wherein said wavelength ranges from about 255 nm to about 2 microns.

4. The method of claim 1 wherein said first laser parameters include pulse duration, wherein said pulse duration is from about 10 femtoseconds to about 100 microseconds.

5. The method of claim 1 wherein said first laser parameters include pulse temporal shape, wherein said pulse temporal shape is one of Gaussian, tailored or square.

6. The method of claim 1 wherein said first laser parameters include laser power, wherein said laser power ranges from about 0.1 microJoule to about 1.0 milliJoule.

7. The method of claim 1 wherein said first laser fluence ranges from 0.1 microJoules/cm$^2$ to about 200 Joules/cm$^2$.

8. The method of claim 1 wherein said first laser parameters include repetition rate, wherein said repetition rate is about 1 kHz or more.

9. The method of claim 1 wherein said first laser parameters include speed, wherein said speed ranges from about 10 mm/s to about 10 m/s.

10. The method of claim 1 wherein said first laser parameters include pitch, wherein said pitch ranges from 0 microns to about 50 microns.

11. The method of claim 1 wherein said first laser parameters include spot size, wherein said spot size is greater than or equal to about 2 microns.

12. The method of claim 1 wherein said first laser parameters include spot shape, wherein said spot shape is one of Gaussian, Top Hat(round) or Top Hat(square).

13. The method of claim 1 wherein said first laser parameters include focal height, wherein said focal height ranges from −10 mm to +10 mm.

14. The method of claim 1 wherein said second laser parameters include laser type, wherein said laser type includes one of Nd:YAG, Nd:YLF or Nd:YVO$_4$ or fiber laser.

15. The method of claim 1 wherein said second laser parameters include wavelength, wherein said wavelength ranges from about 255 nm to about 2 microns.

16. The method of claim 1 wherein said second laser parameters include pulse duration, wherein said pulse duration is from about 10 femtoseconds to about 100 microseconds.

17. The method of claim 1 wherein said second laser parameters include pulse temporal shape, wherein said pulse temporal shape is one of Gaussian, tailored or square.

18. The method of claim 1 wherein said second laser parameters include laser power, wherein said laser power ranges from about 0.1 microJoule to about 1.0 milliJoule.

19. The method of claim 1 wherein said second laser fluence ranges from 0.1 microJoules/cm$^2$ to about 200 Joules/cm$^2$.

20. The method of claim 1 wherein second first laser parameters include repetition rate, wherein said repetition rate is about 1 kHz or more.

21. The method of claim 1 wherein said second laser parameters include speed, wherein said speed ranges from about 10 mm/s to about 10 m/s.

22. The method of claim 1 wherein said second laser parameters include pitch, wherein said pitch ranges from 0 microns to about 50 microns.

23. The method of claim 1 wherein said second laser parameters include spot size, wherein said spot size is greater than or equal to about 2 microns.

24. The method of claim 1 wherein said second laser parameters include spot shape, wherein said spot shape is one of Gaussian, Top Hat(round) or Top Hat(square).

25. The method of claim 1 wherein said second laser parameters include focal height, wherein said focal height ranges from −10 mm to +10 mm.

26. An apparatus for laser machining a workpiece comprising:
  a laser having laser pulses and laser pulse parameters;
  laser optics operative to direct said laser pulses to said workpiece;
  motion stages operative to move said workpiece in relation to said laser pulses at the direction of said controller; and
  a controller operative to control said laser pulse parameters, said motion stages and said laser optics,
  wherein said controller, in cooperation with said laser, laser optics and motion stages, is configured to:
    perform a first cutting process with first laser parameters to make a first cut at a first location on the workpiece; and
    after performing said first cutting process, perform a second cutting process with second laser parameters to make a second cut at a second location adjacent to said first location,
    wherein said first laser parameters and said second laser parameters are selected such that a first laser fluence at the workpiece during the first cutting process is lower than a second laser fluence at the workpiece during the second cutting process, and
    wherein said second cutting process is performed at a location substantially adjacent to a space created by said first cut such that debris generated during said second cutting process is transmittable into said space.

27. The apparatus of claim 26 wherein said first laser parameters include laser type, wherein said laser type includes one of Nd:YAG, Nd:YLF or Nd:YVO$_4$ or fiber laser.

28. The apparatus of claim 26 wherein said first laser parameters include wavelength, wherein said wavelength ranges from about 255 nm to about 2 microns.

29. The apparatus of claim 26 wherein said first laser parameters include pulse duration, wherein said pulse duration is from about 10 femtoseconds to about 100 microseconds.

30. The apparatus of claim 26 wherein said first laser parameters include pulse temporal shape, wherein said pulse temporal shape is one of Gaussian, tailored or square.

31. The apparatus of claim 26 wherein said first laser parameters include laser power, wherein said laser power ranges from about 0.1 microJoule to about 1.0 milliJoule.

32. The apparatus of claim 26 wherein said first laser fluence ranges from 0.1 microJoules/cm$^2$ to about 200 Joules/cm$^2$.

33. The method apparatus of claim 26 wherein said first laser parameters include repetition rate, wherein said repetition rate is about 1 kHz or more.

34. The apparatus of claim 26 wherein said first laser parameters include speed ranges, wherein said speed from about 10 mm/s to about 10 m/s.

35. The apparatus of claim 26 wherein said first laser parameters include pitch, wherein said pitch ranges from 0 microns to about 50 microns.

36. The apparatus of claim 26 wherein said first laser parameters include spot size, wherein said spot size is greater than or equal to about 2 microns.

37. The apparatus of claim 26 wherein said first laser parameters include spot shape, wherein said spot shape is one of Gaussian, Top Hat(round) or Top Hat(square).

38. The apparatus of claim 26 wherein said first laser parameters include focal height, wherein said focal height ranges from −10 mm to +10 mm.

39. The apparatus of claim 26 wherein said second laser parameters include laser type, wherein said laser type includes one of Nd:YAG, Nd:YLF or Nd:YVO$_4$ or fiber laser.

40. The apparatus of claim 26 wherein said second laser parameters include wavelength, wherein said wavelength ranges from about 255 nm to about 2 microns.

41. The apparatus of claim 26 wherein said second laser parameters include pulse duration, wherein said pulse duration is from about 10 femtoseconds to about 100 microseconds.

42. The apparatus of claim 26 wherein said second laser parameters include pulse temporal shape, wherein said pulse temporal shape is one of Gaussian, tailored or square.

43. The apparatus of claim 26 wherein said second laser parameters include laser power, wherein said laser power ranges from about 0.1 microJoule to about 1.0 milliJoule.

44. The apparatus of claim 27 wherein said second laser fluence ranges from 0.1 microJoules/cm$^2$ to about 200 Joules/cm$^2$.

45. The apparatus of claim 26 wherein second first laser parameters include repetition rate, wherein said repetition rate is about 1 kHz or more.

46. The apparatus of claim 26 wherein said second laser parameters include speed, wherein said speed ranges from about 10 mm/s to about 10 m/s.

47. The apparatus of claim 26 wherein said second laser parameters include pitch, wherein said pitch ranges from 0 microns to about 50 microns.

48. The apparatus of claim 26 wherein said second laser parameters include spot size, wherein said spot size is greater than or equal to about 2 microns.

49. The apparatus of claim 26 wherein said second laser parameters include spot shape, wherein said spot shape is one of Gaussian, Top Hat(round) or Top Hat(square).

50. The apparatus of claim 26 wherein said second laser parameters include focal height, wherein said focal height ranges from −10 mm to +10 mm.

* * * * *